United States Patent
Park et al.

(10) Patent No.: US 8,471,279 B2
(45) Date of Patent: Jun. 25, 2013

(54) NANO/MICRO-SIZED DIODE AND METHOD OF PREPARING THE SAME

(75) Inventors: Jinhwan Park, Yongin-si (KR); Sungho Park, Suwon-si (KR)

(73) Assignees: Samsung Electronics Co., Ltd., Suwon-si (KR); Sungkyunkwan University Foundation for Corporate Collaboration, Suwon-si (KR)

( * ) Notice: Subject to any disclaimer, the term of this patent is extended or adjusted under 35 U.S.C. 154(b) by 454 days.

(21) Appl. No.: 12/240,156

(22) Filed: Sep. 29, 2008

(65) Prior Publication Data

US 2009/0212275 A1    Aug. 27, 2009

(30) Foreign Application Priority Data

Feb. 22, 2008   (KR) .................................. 2008-16371

(51) Int. Cl.
*H01L 33/00*   (2010.01)
(52) U.S. Cl.
USPC ...................... 257/97; 257/E51.015; 977/762
(58) Field of Classification Search
USPC .................. 257/9, E21.09, E29.005, 94, 96,
257/97, 103, E51.015; 438/478, 82, 99; 977/762
See application file for complete search history.

(56) References Cited

U.S. PATENT DOCUMENTS

| | | | |
|---|---|---|---|
| 7,435,996 B2 * | 10/2008 | Jin et al. ......................... 257/88 |
| 7,635,600 B2 | 12/2009 | Zhang et al. |
| 7,682,449 B2 | 3/2010 | Jang et al. |
| 2002/0172820 A1 * | 11/2002 | Majumdar et al. ............ 428/357 |
| 2003/0077515 A1 * | 4/2003 | Chen et al. .................. 429/231.8 |
| 2006/0270074 A1 * | 11/2006 | Kim ................................ 438/22 |
| 2007/0048477 A1 | 3/2007 | Oh |
| 2007/0077429 A1 | 4/2007 | Mirkin et al. |
| 2008/0149914 A1 * | 6/2008 | Samuelson et al. ............... 257/9 |

FOREIGN PATENT DOCUMENTS

| | | | |
|---|---|---|---|
| JP | 60218865 A | * | 11/1985 |
| JP | 2007-142386 | | 6/2007 |
| KR | 10-2006-0093642 | | 8/2006 |
| KR | 10-2007-0015260 | | 2/2007 |

\* cited by examiner

*Primary Examiner* — David Vu
(74) *Attorney, Agent, or Firm* — Stein IP, LLC

(57) ABSTRACT

A nano/micro-sized diode and a method of preparing the same, the diode including: a first electrode; a second electrode; and a diode layer that is disposed between the first electrode and the second electrode. The diode layer includes a first layer and a second layer. The first layer is disposed on the first electrode and has a first surface that is electrically connected to the first electrode, and an opposing second surface that has a protrusion. The second layer is disposed between the first layer and the second electrode and has a first surface having a recess that corresponds to the protrusion, and an opposing second surface that is electrically connected to the second electrode.

11 Claims, 21 Drawing Sheets

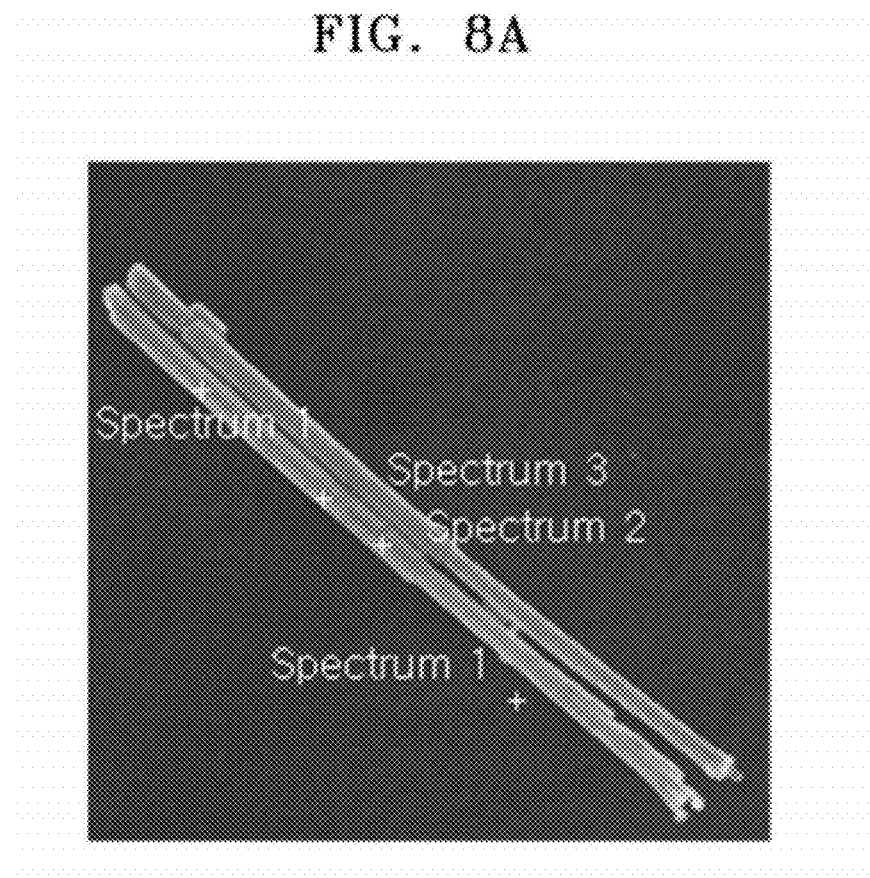

NANO/MICRO-SIZED DIODE AND METHOD OF PREPARING THE SAME

CROSS-REFERENCE TO RELATED PATENT APPLICATION

This application claims the benefit of Korean Patent Application No. 2008-16371, filed on Feb. 22, 2008, in the Korean Intellectual Property Office, the disclosure of which is incorporated herein, by reference.

BACKGROUND OF THE INVENTION

1. Field of the Invention

Aspects of the present invention relate to a nano/micro-sized diode and a method of preparing the same.

2. Description of the Related Art

Currently, there is a trend toward producing electronic devices that are smaller and have faster operational speeds/capabilities. However, due to the limitations of conventional technologies, there is a need to develop new technologies to address these challenges. Thus, much research is being conducted into nanoscience and nanotechnology. Nanotechnology is used to make nanometer scale materials that can maximize information storage and processing. Thus, nanotechnology is drawing much attention as a technology for use in industries, such as information technology, biotechnology, etc. Nanoscience is divided into two fields: the synthesis of materials, such as carbon nanotubes, C60, mesoporous materials, metallic and semiconductor nanocrystallines (nanocrystal, nanocluster, quantum dot), or the like; and the control and application of nanomaterials, using scanning tunneling microscopy (STM), atomic force microscope (AFM), or lithography.

Nano electro mechanical system (NEMS) technology and micro electro mechanical system (MEMS) technology refer to technologies related to miniature precision machinery. These technologies are expected to outperform current semiconductor technology. The NEMS and MEMS technologies are derived from semiconductor technology, relate to three-dimensional space, and are being researched for applying nanotechnology in various types of devices. Thus, research into nanoparticles, nanowires, nano-multilayer structures, and the like is being actively conducted. Methods of electrochemically preparing such nanostructures are drawing much attention because of various advantages, such as cost reduction, design simplicity, and flexibility in the building complex shapes.

SUMMARY OF THE INVENTION

According to an aspect of the present invention, there is provided a nano/micro-sized diode comprising: a first electrode; a second electrode; and a diode layer that is disposed between the first electrode and the second electrode. The diode layer comprises a first layer and a second layer. The first layer is disposed between the first electrode and the second layer, and the second layer is disposed between the first layer and the second electrode. The first layer has a first surface that is electrically connected to the first electrode, and an opposing second surface that has a protrusion. The second layer comprises a first surface having a recess that corresponds to the protrusion of the first layer, and an opposing second surface. The second surface of the second layer is electrically connected to the second electrode.

According to aspects of the present invention, the nano/micro-sized diode may further comprise a control layer disposed between the second electrode and the diode layer. The second surface of the second layer may be electrically connected to the control layer.

According to aspects of the present invention, the first surface of the second layer may entirely cover the second surface of the first layer.

According to aspects of the present invention, the second layer may be wider than the first layer.

According to another aspect of the present invention, there is provided a method of preparing a nano/micro-sized diode, the method comprising: preparing a porous template comprising a plurality of holes; forming first electrodes in the bottom of the holes; forming a material layer on the first electrodes; heat-treating the material layer to form first layers, which have first surfaces that are electrically connected to the first electrodes, and opposing second surfaces having protrusions; forming second layers on the first layers, the second layers having first surfaces having recesses corresponding to the protrusions; forming second electrodes on the second layers; and removing the porous template, to obtain a plurality of nano/micro-sized diodes.

According to aspects of the present invention, the method of preparing a nano/micro-sized diode may further comprise forming control layers on the second layers.

According to aspects of the present invention, the method of preparing a nano/micro-sized diode may further comprise expanding a space between the protrusions and the walls of the holes.

According to aspects of the present invention, the nano/micro-sized diode has excellent durability. In addition, by using the preparation method of the present invention, nano/micro-sized diodes can be mass-produced at a high yield, with a uniform size and excellent quality.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 8A is a scanning electron microscope (SEM) image of a nano/micro-sized diode, according to an exemplary embodiment of the present invention;

DETAILED DESCRIPTION OF THE EXEMPLARY EMBODIMENTS

Figure 1A:
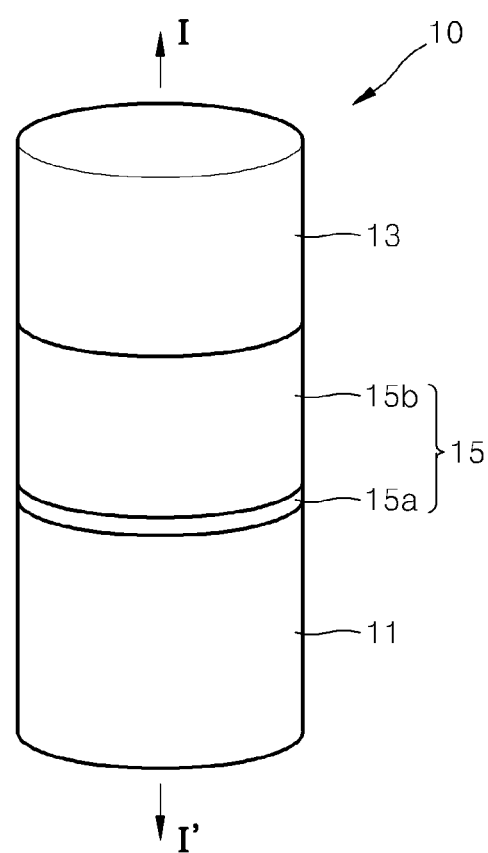
FIG. 1A is a schematic diagram illustrating a nano/micro-sized diode, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Figure 1B:
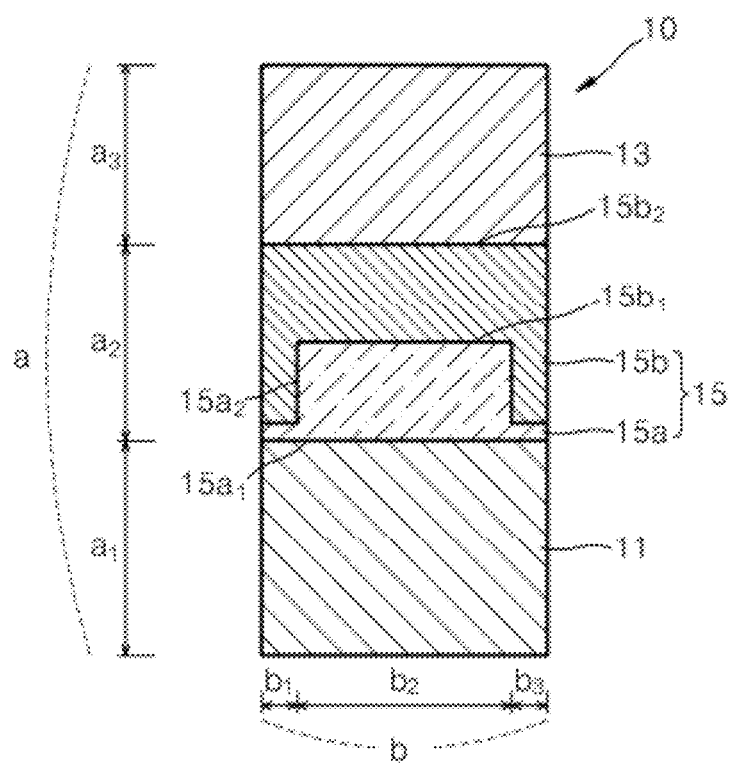
FIG. 1B is a schematic cross-sectional view taken along line I-I' of FIG. 1A.

FIG. 1A is a schematic diagram illustrating a nano/micro-sized diode 10, according to an exemplary embodiment of the present invention. FIG. 1B is a schematic cross-sectional view taken along line I-I' of FIG. 1A.

The term "nano/micro sized" refers to a parameter that can define the size of a diode, for example, at least one of length, diameter, and width, in units ranging from several nanometers to several tens of micrometers. As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Referring to FIGS. 1A and 1B, the nano- or micro-sized diode 10 includes a first electrode 11, a diode layer 15, and a second electrode 13, which are sequentially stacked. The first electrode 11 may comprise a conductive material, and in particular, an electrochemically stable conductive material. The first electrode 11 may comprise a material selected from the group consisting of Pt, Au, Al, Ni, Mo, W, ITO, carbon, carbon nanotubes, and conducting polymers; however, the present invention is not limited thereto.

In the diode layer 15, a net current flows, and a reverse current is blocked. The diode layer 15 includes a first layer 15a and a second layer 15b. The first layer 15a is disposed between the first electrode 11 and the second layer 15b. The second layer 15b is disposed between the first layer 15a and the second electrode 13.

The first layer 15a has a first surface $15a_1$ that is electrically connected to the first electrode 11, and an opposing second surface $15a_2$ that has a protrusion. In FIG. 1B, the protrusion has a rectangular cross-section. However, this is for schematic illustration purposes only, and the protrusion can be any suitable shape.

The second layer 15b has a first surface $15b_1$, having a recess corresponding to the protrusion, and an opposing second surface $15b_2$ that is electrically connected to the second electrode 13.

The first layer 15a may comprise a material having p-type semiconductor properties. Examples of the material include conducting polymers that have polymeric mechanical properties that can be transferred to a semiconductor or conductor, from an insulator, through chemical doping. Examples of the conducting polymers include polypyrrole, polyaniline, polythiophene, polypyridine, polyazulene, polyindole, polycarbazole, polyazine, polyquinone, poly(3,4-ethylenedioxythiophene), polyacetylene, polyphenylene sulfide, polyphenylene vinylene, polyphenylene, polyisothianaphthene, poly(2-methoxy-5-(2'-ethyl)hexyloxy-p-phenylenevinylene (MEH-PPV), a mixture of polyethylenedioxythiophene (PEDOT) and polystyrenesulfonate (PSS), polyfuran, polythienylene vinylene, and a derivative thereof. However, the present invention is not limited thereto. Alternatively, the first layer 15a may comprise a metal oxide having p-type semiconductor properties. Examples of the metal oxide include indium-tin oxide (ITO), indium-zinc oxide (IZO), and the like. However, the present invention is not limited thereto.

The second layer 15b may comprise a semiconducting material. Examples of the semiconducting material include cadmium selenide (CdSe), cadmium telluride (CdTe), cadmium sulfide (CdS), zinc oxide (ZnO), and the like. However, the present invention is not limited thereto. The CdSe refers to an alloy of cadmium (Cd) and selenium (Se) that has n-type semiconductor properties and can act as a photocell when irradiated with light.

As described above, the diode layer 15 may include the p-type first layer 15a and the n-type second layer 15b, so that a p-n junction is formed therebetween. Thus, when light enters the diode layer 15, or a voltage is applied thereto, electrons are transferred to the second electrode 13, via the second layer 15b, and holes are transferred to the first electrode 11, via the first layer 15a. As a result, electrical signals can be generated. Therefore, a diode, in which electrons and holes can be readily separated, can be provided.

The diode layer 15 includes the first layer 15a and the second layer 15b. The second surface $15a_2$ of the first layer 15a has the protrusion, and the first surface $15b_1$ of the second layer 15b has the recess that corresponds to the protrusion. The second surface $15a_2$ is completely covered by the first surface $15b_1$. Thus, the interface between the second surface $15a_2$ and the first surface $15b_1$ can be relatively increased. Due to this, the diode layer 15 is mechanically very strong. Therefore, during preparation of the nano/micro sized diode 10, a yield reduction, caused by a break down of the diode layer 15, can be prevented. In addition, during storage and transportation of the diode 10, damage caused by the break down of the diode layer 15 can be prevented.

The second electrode 13 is formed on the diode layer 15. The second electrode 13 is electrically connected to the second surface $15b_2$ of the second layer 15b. A material used to form the second electrode 13 may be conductive, and in particular, may be an electrochemically stable conductive material. Examples of the material used to form the second electrode 13 include Pt, Au, Al, Ni, Mo, W, ITO, carbon, carbon nanotubes, and conducting polymers. However, the present invention is not limited thereto.

The nano/micro sized diode 10 illustrated in FIG. 1A is in the form of a cylindrical nanorod. The nano/micro sized diode 10 has a length a (thickness) and/or a cross-section width b (diameter) in the range of several nanometers to tens of micrometers. For example, the length a of the nano/micro sized diode 10 may be in the range of from 500 nm to 100 μm, and the diameter b may be in the range of 30 to 1000 nm. However, the present invention is not limited thereto, and the length and diameter of the nano/micro sized diode 10 may vary, according to the reaction conditions when the diode 10 is prepared. In addition, a length ratio, of each part of the nano/micro sized diode 10 illustrated in FIG. 1B, may vary according to reaction conditions. For example, a ratio of $a_1:a_2:a_3$ of the nano/micro sized diode 10 may be 30:15:20, and a ratio of $b_1:b_2:b_3$ may be 1:15:1. However, the present invention is not limited thereto.

Although not specifically illustrated in the drawings, the nano/micro sized diode 10 may have different shapes and/or sizes, according to the shape and/or size of a hole of a porous template used in the preparation process. In addition to the nanorod form illustrated in FIGS. 1A and 1B, the nano/micro sized diode 10 may be in the form of a nanowire, a nanoneedle, a nanobelt, a nanoribbon, or the like; however, the present invention is not limited thereto.

Figure 2A:
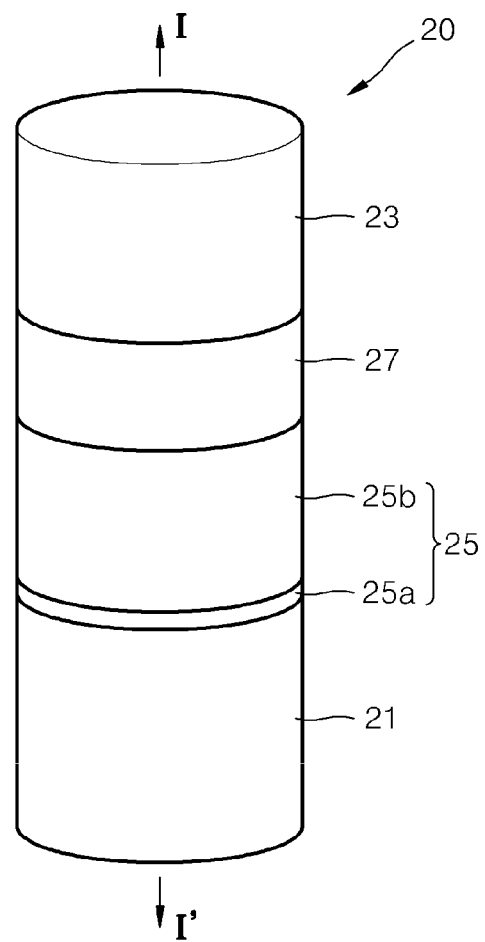
FIG. 2A is a schematic diagram illustrating a nano/micro-sized diode, according to another exemplary embodiment of the present invention.
Figure 2B:
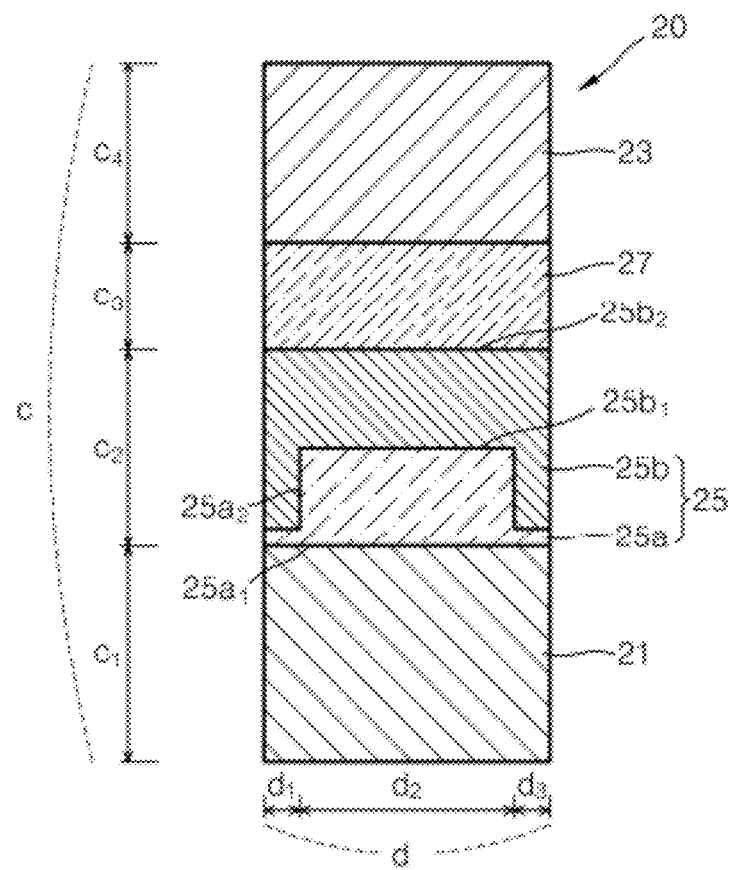
FIG. 2B is a schematic cross-sectional view taken along line I-I' of FIG. 2A.

FIG. 2A is a schematic diagram illustrating a nano/microsized diode 20, according to another exemplary embodiment of the present invention. FIG. 2B is a schematic cross-sectional view taken along line I-I' of FIG. 2A. The nano/microsized diode 20 includes a first electrode 21, a diode layer 25, a control layer 27, and a second electrode 13, which are sequentially stacked.

The diode layer 25 includes the first layer 25a and the second layer 25b. The first layer 25a has a first surface $25a_1$ that is electrically connected to the first electrode 21, and a second surface $25a_2$ that faces the first surface $25a_1$ and has a protrusion. The second layer 25b has a first surface $25b_1$ having a recess corresponding to the protrusion, and an opposing second surface $25b_2$ that is electrically connected to the control layer 27. The first electrode 21, the diode layer 25, and the second electrode 23 are similar to those of FIGS. 1A and 1B, and a detailed description thereof is omitted.

The control layer 27 allows holes and electrons separated from the diode layer 25 to smoothly flow into the first electrode 21 and the second electrode 23, respectively. The control layer 27 may comprise a material selected from the group consisting of Ag, Cu, and Al. However, the present invention is not limited thereto. For the transfer of electrons from the diode layer 25, the first electrode 21 and the control layer 27 may comprise materials that have different work functions.

The nano/micro sized diode 20 illustrated in FIG. 2A is a cylindrical nanorod. The nano/micro sized diode 20 has a length c (thickness) and/or a cross-section width d (diameter) in the range of several nanometers to tens of micrometers. For example, the length c of the nano/micro sized diode 20 may be in the range of from 500 nm to 100 μm, and the diameter d thereof may be in the range of 30 to 1000 nm. However, the present invention is not limited thereto, and the length and diameter of the nano/micro sized diode 20 may vary, according to reaction conditions. In addition, a length ratio of each part of the nano/micro sized diode 20 may vary according to reaction conditions. For example, a ratio of $c_1:c_2:c_3:c_4$ of the nano/micro sized diode 20 may be 30:15:5:20, and a ratio of $d_1:d_2:d_3$ may be 1:15:1. However, the present invention is not limited thereto.

Figure 3A:
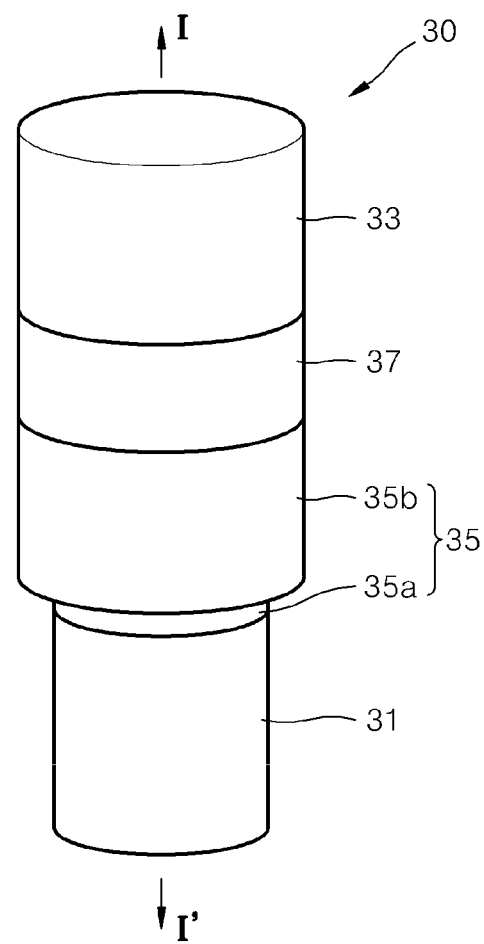
FIG. 3A is a schematic diagram illustrating a nano/micro-sized diode, according to another exemplary embodiment of the present invention.
Figure 3B:
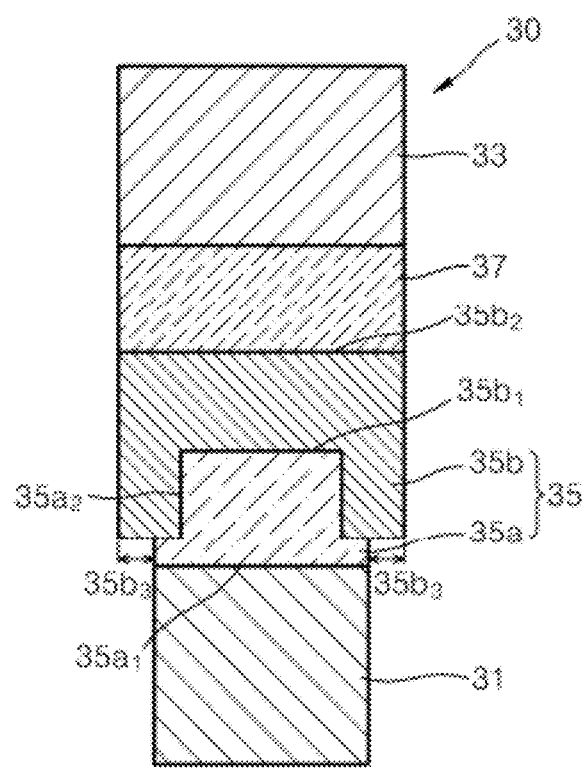
FIG. 3B is a schematic cross-sectional view taken along line I-I' of FIG. 3A.

FIG. 3A is a schematic diagram illustrating a nano/microsized diode 30, according to another exemplary embodiment of the present invention. FIG. 3B is a schematic cross-sectional view taken along line I-I' of FIG. 3A.

The nano/micro-sized diode 30, of FIGS. 3A and 3B, includes a first electrode 31, a diode layer 35, a control layer 37, and a second electrode 33, which are sequentially stacked. The diode layer 35 includes the first layer 35a and the second layer 35b. The first layer 35a has a first surface $35a_1$ that is electrically connected to the first electrode 31, and an opposing second surface $35a_2$ that has a protrusion. The second layer 35b has a first surface $35b_1$ having a recess corresponding to the protrusion, and an opposing second surface $35b_2$ that is electrically connected to the control layer 37.

A portion $35b_3$ of the first surface $35b_1$ of the second layer 35b does not contact the second surface $35a_2$ of the first layer 35a. Such a structure can be formed by expanding a space between the protrusion and the walls of a hollow channel of a porous template, before forming the second layer 35b, and after forming the first layer 35a. As a result, the second layer 35b can be strengthened. The first electrode 31, the diode layer 35, the control layer 37, and the second electrode 33 are similar to those of FIGS. 1A, 1B, 2A, and 2B, and a detailed description thereof, is omitted.

Nano/micro-sized diodes, according to aspects of the present invention, have been described with reference to FIGS. 1A through 3B. However, the present invention is not limited thereto, and various other embodiments are possible. For example, the control layer 37, of the nano or micro-sized diode 30 of FIG. 3A, can be omitted.

A nano/micro-sized diode, according to aspects of the present invention, can be used in opto-devices, optical sensors, solar cells, energy sources for nano electro mechanical systems (NEMS), micro electro mechanical systems (MEMS), optical switches, sensors for a chemical material or biochemical material, and the like. Opto-devices are light emitting devices that convert an electrical signal to an optical signal, or an optical signal into an electrical signal, and include any kind of device that modulates or mixes light with an electrical signal.

The nano/micro-sized diode, according to aspects of the present invention, can be mass produced using a porous template that includes a plurality of holes. Herein, the diode layer of the nano/micro-sized diode has the first layer having the protrusion and the second layer having the recess corresponding to the protrusion, and thus, the nano/micro-sized diode can have improved mechanical durability. Therefore, the breakage of the diode layer during the preparation of the diode, and the like, can be substantially prevented, and thus, the nano/micro-sized diode can be obtained with high yield.

Figure 4A:
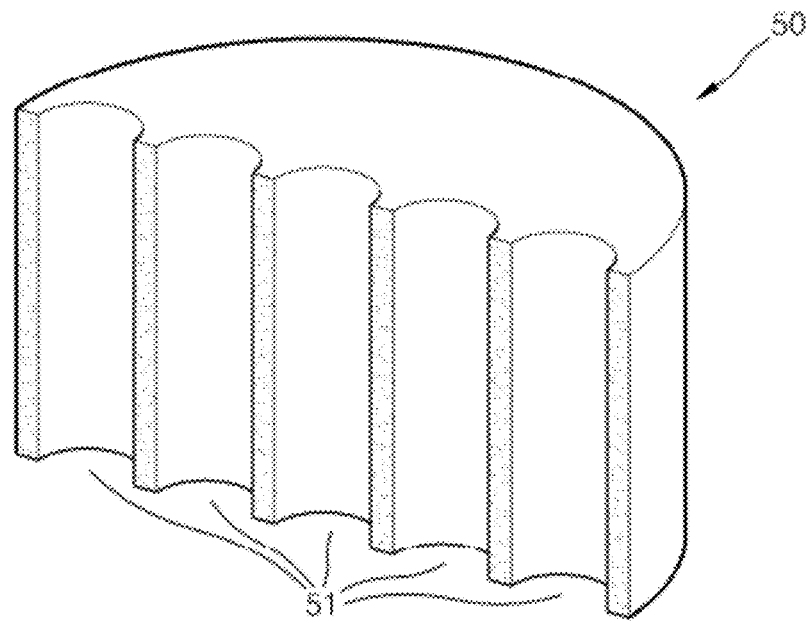
FIGS. 4A through 4G are cross-sectional views sequentially illustrating a method of preparing a nano/micro-sized diode, according to an exemplary embodiment of the present invention.

FIGS. 4A through 4G are views sequentially illustrating a method of preparing a nano/micro-sized diode, according to an exemplary embodiment of the present invention, and simultaneously illustrate the cross-section of a porous template and the cross-sections of the nano/micro-sized diodes formed therein. As illustrated in FIG. 4A, a porous template 50, including a plurality of holes 51, is prepared. The holes 51 may have diameters of from 250 to 300 nm, but the diameters of the holes 51 can be altered, according to the types of nano/micro-sized diodes to be formed.

The material of the porous template 50 is not particularly limited. Examples of the material of the porous template 50 include an anodic aluminum oxide (AAO) membrane, a polycarbonate template, an anodic titania membrane, a porous membrane of a polymer including polypropylene, nylon, polyester, and block copolymers thereof, and the like. The shapes and sizes of the holes 51 are not particularly limited.

The porous template 50 may be an AAO membrane, which can be prepared by anodization. The holes 51 of the porous template 50 are regularly arranged, and the arrangement, lengths, and diameters of the holes 51 can be adjusted, according to conditions in the preparation of the porous template 50. In the case of the AAO membrane, the lengths and diameters of the holes 51 can be adjusted according to the oxidation conditions during the anodization of the membrane, i.e., the types of solutions, the oxidation temperatures, electric potential differences between the anode and cathode, oxidation times, and the like.

Figure 4B:
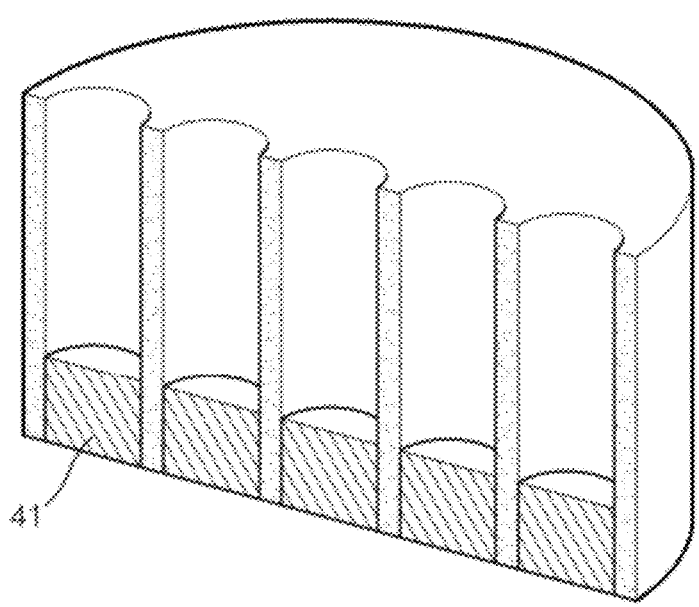

As illustrated in FIG. 4B, first electrodes 41 are formed in one end (the bottoms) of the holes 51. When the first electrodes 41 are formed by electroplating, a working electrode is first formed on the bottom portion of the porous template 50, although this is not illustrated in FIG. 4B. For example, the working electrode may be an Ag electrode, a counter electrode may be a platinum wire mesh, and a reference electrode may be an Ag/AgCl electrode, a calomel electrode, a standard hydrogen electrode, or the like. However, the present invention is not limited thereto. When the first electrodes 41 are formed by electroplating, a commonly used electropolymerization device can be used. Herein, the electropolymerization device may include a potentiostat that can maintain a constant voltage. A conventional plating solution, in which the material of the first electrodes 41 is dissolved, may be used as a plating solution. For example, when the Au first electrodes 41 are formed by electroplating, the plating solution may be an Orotemp 24 RTU solution (Technic, Inc.). A voltage used in electroplating may vary, according to the material of the first electrodes 41, but may be in the range of approximately −0.9 to −1 V.

Figure 4C:
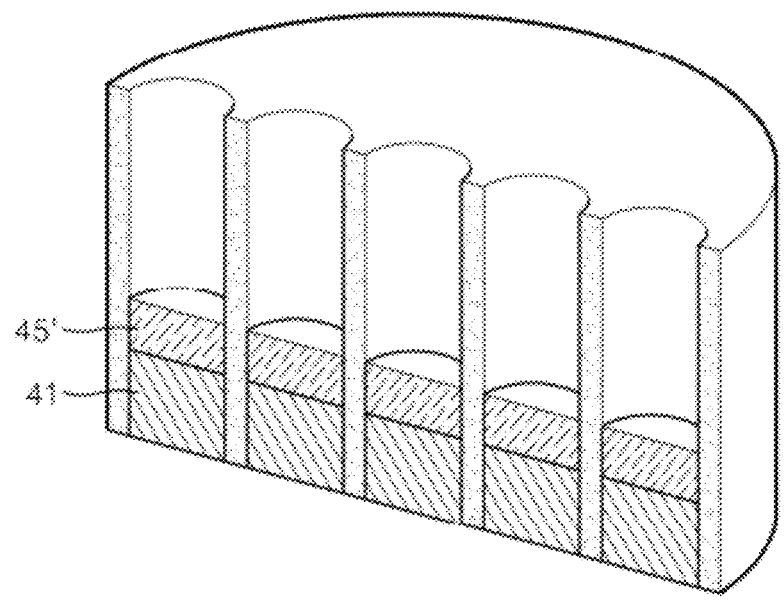

As illustrated in FIG. 4C, material layers 45' are formed on the first electrodes 41. The material layers 45' may be formed by, for example, an electrochemical polymerization, in which a mixture including a first layer precursor and a solvent is used. That is, an electrochemical polymerization device is filled with the mixture, and the porous template 50 is immersed in the mixture. Then, when a current or voltage is applied, the precursor is electrochemically oxidized (polymerization or extraction) onto the first electrodes 41 in the holes, to form the material layers 45'. The material layer 45' includes the precursor, the solvent, and a material for forming the first layers. The material layer 45' can include a conductive polymer, and the first layer precursor may be a monomer of the conducting polymer. In addition, the solvent may be a solvent that can dissolve the monomer (for example, tetraethylammoniumtetrafluoroborate, acetonitrile, or the like). For example, when pyrrole is used as the first layer precursor, and tetraethylammoniumtetrafluoroborate is used as the solvent, the material layer 45' includes pyrrole, tetraethylammoniumtetrafluoroborate, and polypyrrole.

The conditions of the electrochemical polymerization may vary, according to the composition of the material layers 45'. For example, when the material layer 45' comprises polypyrrole, the electrochemical polymerization may be performed at a voltage of 0.9 V, for a polymerization time of about 10 seconds.

Figure 4D:
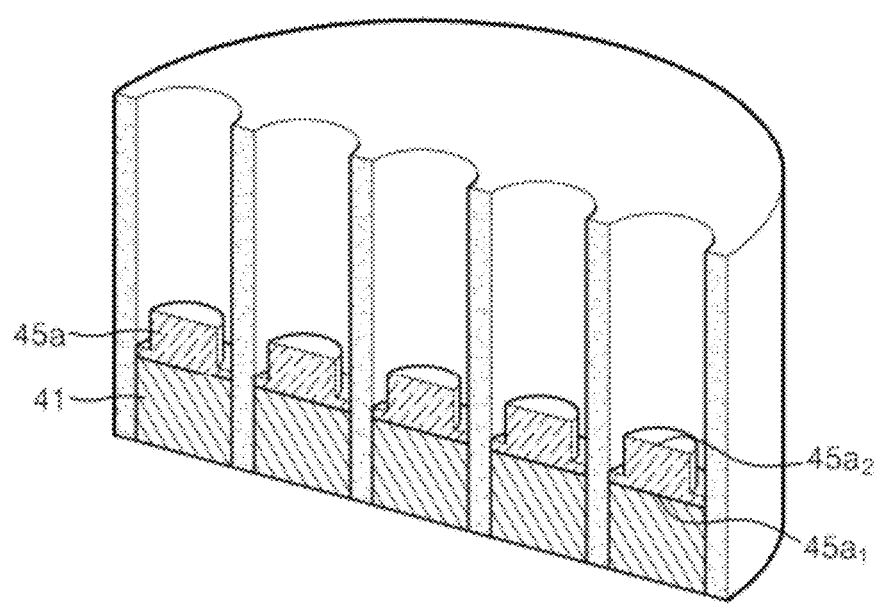

Next, the porous template 50 including the material layers 45' is heat-treated, to remove the solvent and the precursor. As illustrated in FIG. 4D, first layers 45a, which each have a first surface 45a_1 that is electrically connected to the first electrode 41, and a second surface 45a_2 having a protrusion, are formed. That is, the precursor is removed, to contract the material layers 45', and consequently, form the protrusions on the second surfaces 45a_2. Thus, spaces, between the protrusions and the walls of the holes 51, may be formed.

Herein, the size and shape of the protrusion can be controlled by adjusting a heat treatment temperature and time, during the formation of the first layers 45a. For example, the material layers 45' may be heat-treated at a temperature in the range of 25 to 150° C., for 1 to 24 hours; however, the present invention is not limited thereto.

Figure 4E:
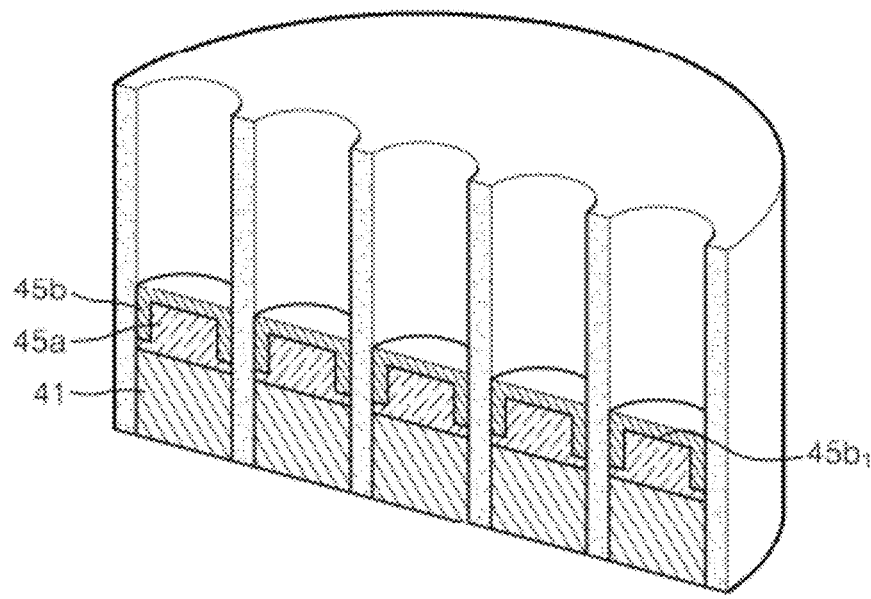

Next, a material for forming second layers 45b is disposed on the first layers 45a. The second layers 45b each have a first surface 45b_1 having recesses corresponding to the protrusions of the second surfaces 45a_2, as illustrated in FIG. 4E. The second layers 45b can be formed by immersing the porous template 50 in a mixture including the material for forming the second layers, and then electrochemically reducing the material. The material can surround the protrusions. Thus, the second layers 45b can be formed, as illustrated in FIG. 4E.

By forming the first layers 45a and the second layers 45b using the methods described above, a diode layer of the nano/micro-sized diode has excellent mechanical durability. Therefore, the diode layers are protected from damage, during the mass production of the diode. In addition, the diodes are protected from damage during storage and transportation.

Figure 4F:
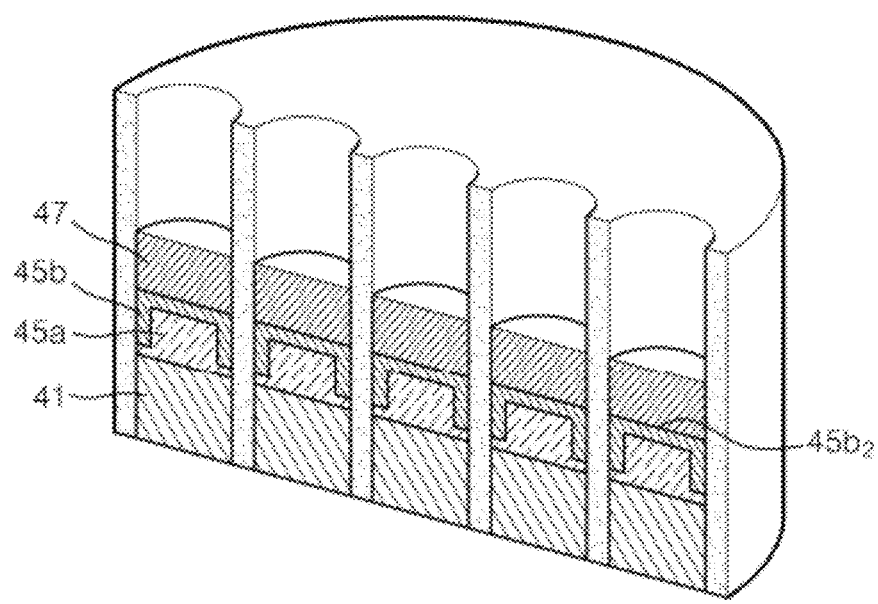
Figure 4G:
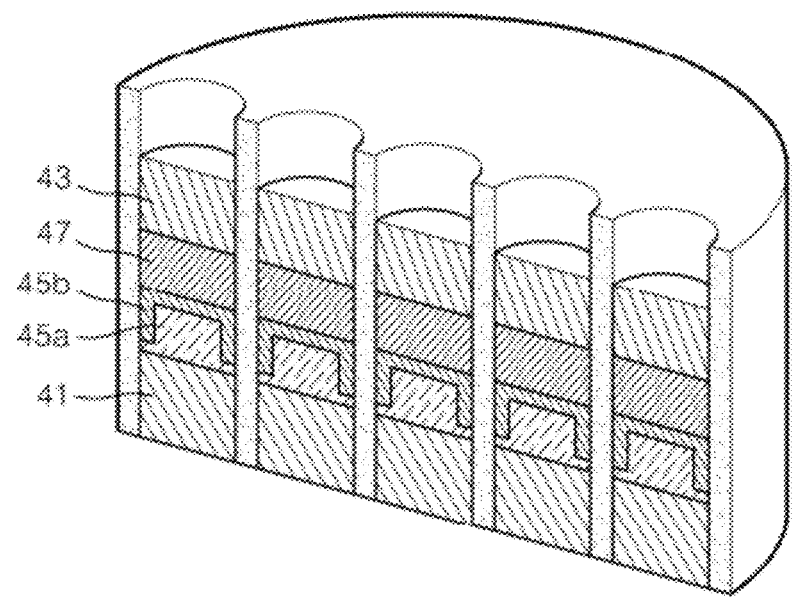

Next, as illustrated in FIG. 4F, a control layer 47 is formed on each of the second layers 45b. As illustrated in FIG. 4G, a second electrode 43 is formed on each of the control layers 47. The control layers 47 and the second electrodes 43 may be formed by the electroplating method used to form the first electrodes 41.

Lastly, the porous template 50 is removed, to obtain a plurality of nano/micro-sized diodes. The porous template 50 may be removed using a conventional method, such as wet etching, dry etching, photoetching, pyrolysis, or the like.

The wet etching is performed using an etchant, which is an acid or base that selectively removes only the porous template 50, such as, a sodium hydroxide solution, an aqueous acetic acid solution, hydrofluoric acid, an aqueous phosphoric acid solution, or the like. The dry etching is performed using a gas, a plasma, an ion beam, or the like. Examples of the dry etching include reactive ion etching (RIE), in which a reactive gas plasma is activated, to chemically volatize with the porous template 50, and inductively coupled plasma reactive ion etching (ICP-RIE), in which the ICP is used as an activation source.

When the nano/micro-sized diodes 30 are prepared using the porous template 50, the lengths of the first electrode, the diode layer, the control layer, and the second electrode are adjusted, by monitoring the charges passing through each layer. Accordingly, the nano/micro-sized diode 30 can be mass-produced at a high yield.

Figure 5A:
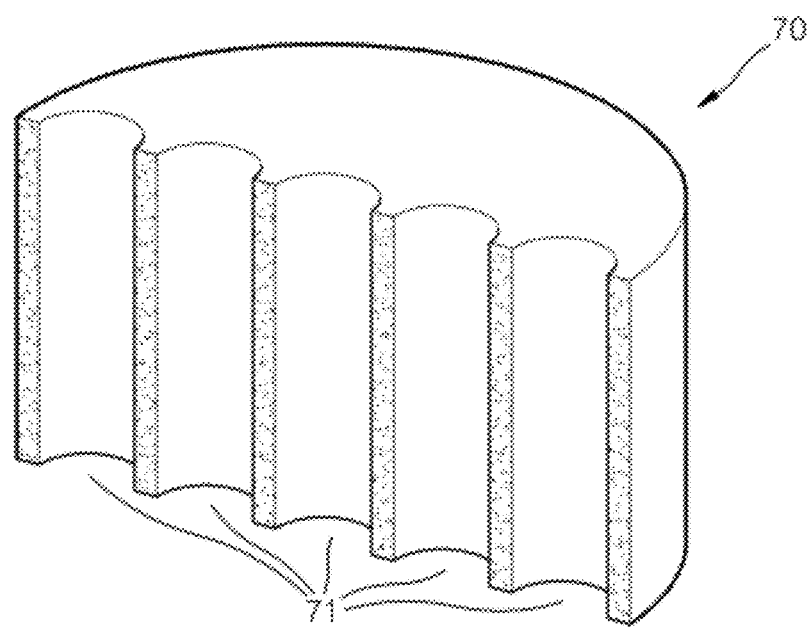
FIGS. 5A through 5H are cross-sectional views sequentially illustrating a method of preparing a nano/micro-sized diode, according to another exemplary embodiment of the present invention.

FIGS. 5A through 5H are cross-sectional views sequentially illustrating a method of preparing a nano/micro-sized diode, according to another exemplary embodiment of the present invention. As illustrated in FIG. 5A, a porous template 70, including a plurality of holes 71, is prepared.

Figure 5B:
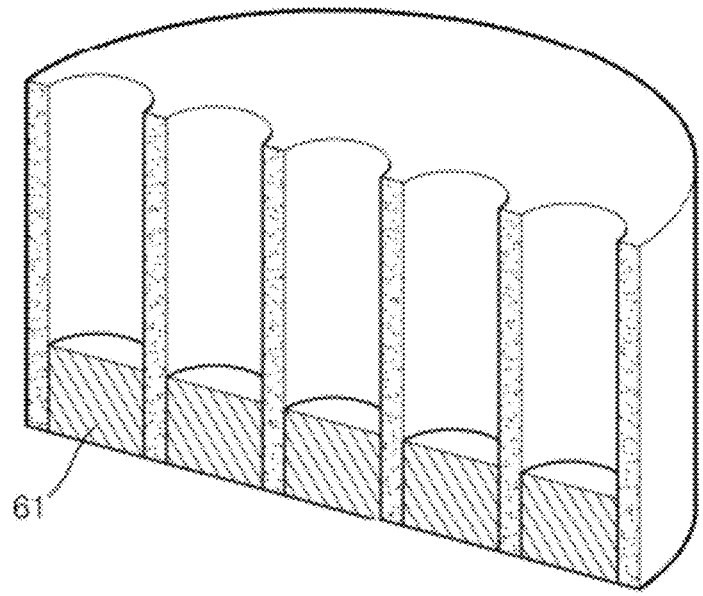
Figure 5C:
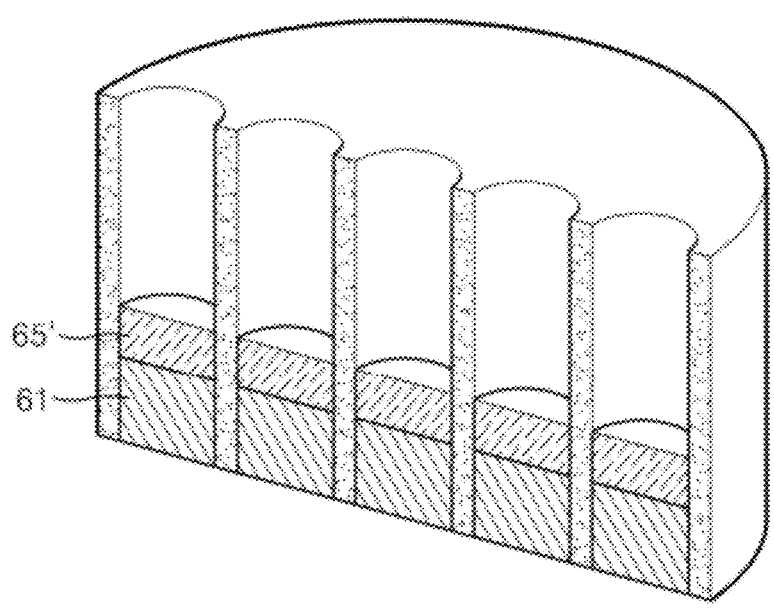
Figure 5D:
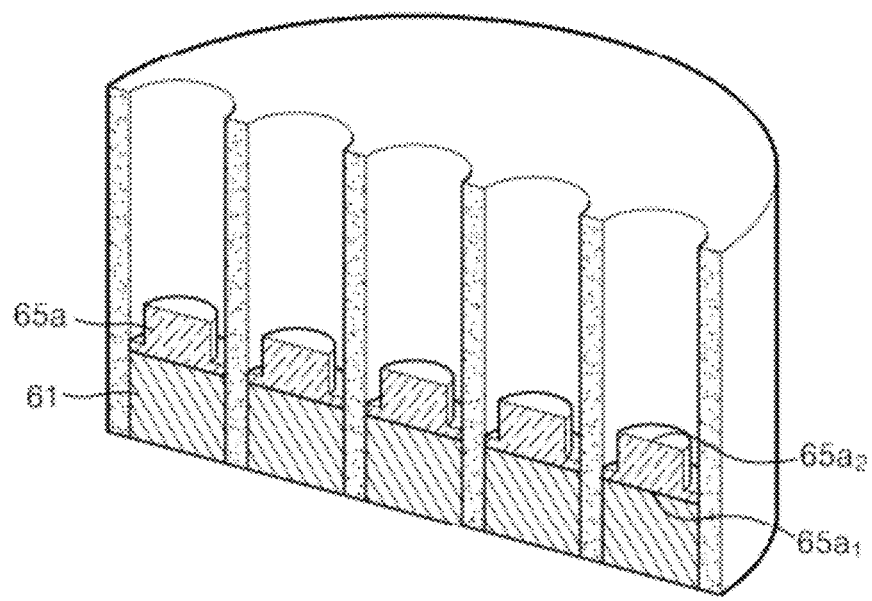

Next, as illustrated in FIG. 5B, first electrodes 61 are formed in the bottoms of the holes 71. As illustrated in FIG. 5C, material layers 65' are formed on the first electrodes 61 and then heat-treated, to form the first layers 65a, as illustrated in FIG. 5D. The first layers 65a each have a first surface 65a_1 that is electrically connected to the corresponding first electrode 61, and a second surface 65a_2 having a protrusion.

Figure 5E:
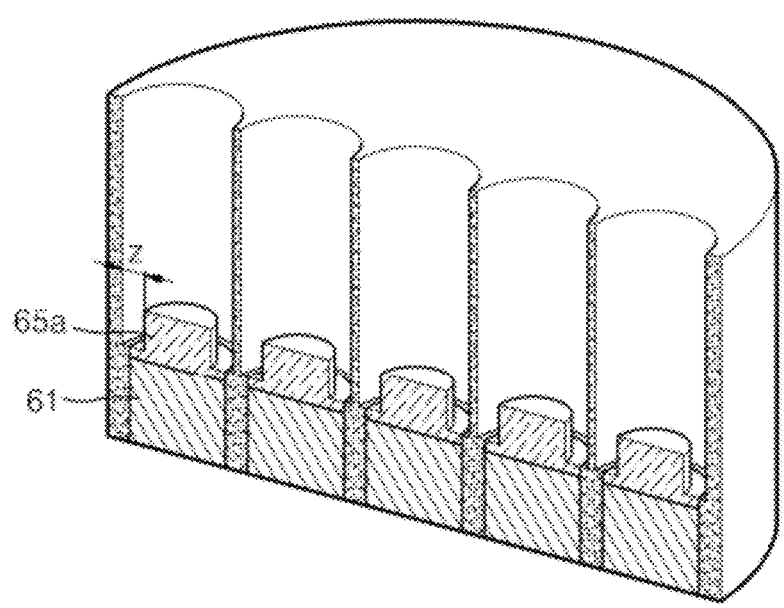

As illustrated in FIG. 5E, an acidic or basic solution is applied to the holes 71, to expand space z between the protrusions of the first layers 65a and the walls of the holes 71. The acidic or basic solution can be a solution that does not react with the first layer 65a and can selectively dissolve the walls of the holes 71. For example, an aqueous sodium hydroxide solution can be used.

Figure 5F:
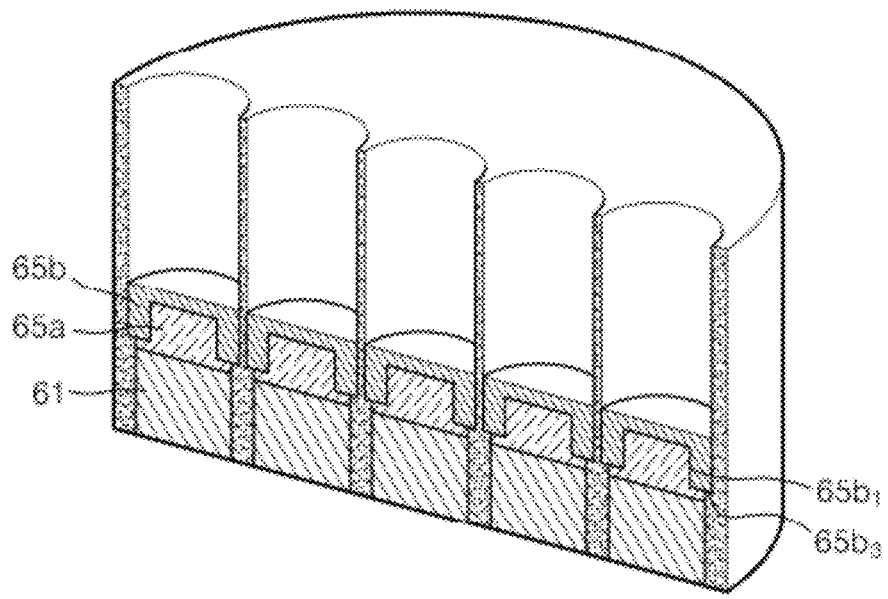
Figure 5G:
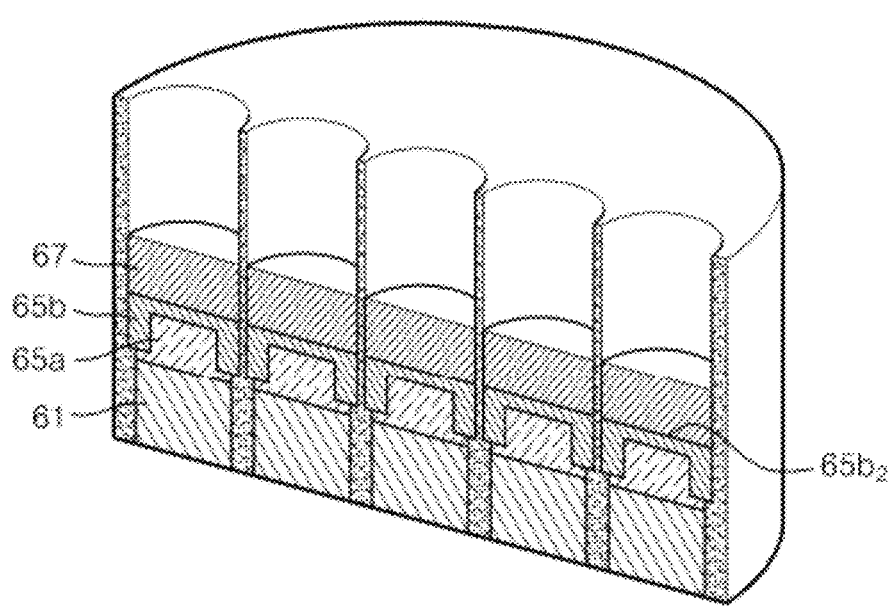

As illustrated in FIG. 5F, second layers 65b that have a first surface 65b₁ may be formed. The first surfaces 65b₁ have a portion 65b₃ that does not contact the second surface 65a₂ of the first layer 65a.

As illustrated in FIG. 5F, since the second layer 65b is formed after the space z is expanded, the width of the second layer 65b can be relatively increased, as compared to the width of the first layer 65a. Accordingly, current-voltage characteristics of the nano/micro-sized diode can be improved.

As illustrated in FIG. 5, control layers 67 are formed on the second layers 65b. Then, as illustrated in FIG. 5H, second electrodes 63 are formed on the control layers 67. Lastly, the porous template 70 is removed, as described above, to obtain a plurality of nano/micro-sized diodes.

Since the control layers 67 and the second electrodes 63 are formed after the walls of the holes 71 are partially dissolved, as illustrated in FIG. 5E, the widths of the control layers 67 and the second electrodes 63 are the same as the widths of the second layers 65b. As a result, the nano/micro-sized diode 30 can be mass-produced at a high yield.

Hereinafter, aspects of the present invention will be described more specifically with reference to the following examples. The following examples are for illustrative purposes and are not intended to limit the scope of the invention.

Example 1

Preparation of First Electrode and First Layer

A porous anodic aluminum oxide (AAO) template (Whatman International Ltd.), having a diameter of 13 mm and including a plurality of holes, was prepared. The diameter of each hole was 300 nm. An Ag thin film, having a thickness of from 200 to 300 nm, was deposited on the porous AAO template, by thermal deposition. The Ag thin film was used as a working electrode. A platinum wire mesh was used as a counter electrode, and Ag/AgCl was used as a reference electrode.

Subsequently, an electropolymerization device (AutoLab, PGSTAT100) equipped with a potentiostat was filled with a Technic ACR silver RTU solution (Technic, Inc.), and the porous AAO template was immersed into the solution. A current was applied to the immersed template at a rate of 0.5 C/cm², for 5 minutes, at a constant potential of −0.9 V vs Ag/AgCl, to deposit Ag in each hole of the porous AAO template. Thus, a gap, between the porous AAO template and the thermally deposited Ag thin film, was sealed.

The prepared porous AAO template was immersed in an Orotemp 24 RTU solution (Technic, Inc.), and then Au was electroplated thereto, at −0.9 V vs Ag/AgCl, to form an Au first electrode in each hole of the porous AAO template. The thickness of the Au first electrode was set to 3000 nm, by monitoring charges passing through the Au layer.

Subsequently, the electropolymerization device was filled with a solution of 0.5 M pyrrole, 0.2 M tetraethylammonium tetrafluoroborate, and an acetonitril at a positive potential. A voltage was maintained at 1.0 V vs Ag/AgCl, for 10 seconds, using the potentiostat, to form a layer comprising pyrrole, tetraethylammonium tetrafluoroborate, acetonitrile, and polypyrrole, on the Au first electrodes. The thickness of the layers was set to 700 nm.

Figure 6A:
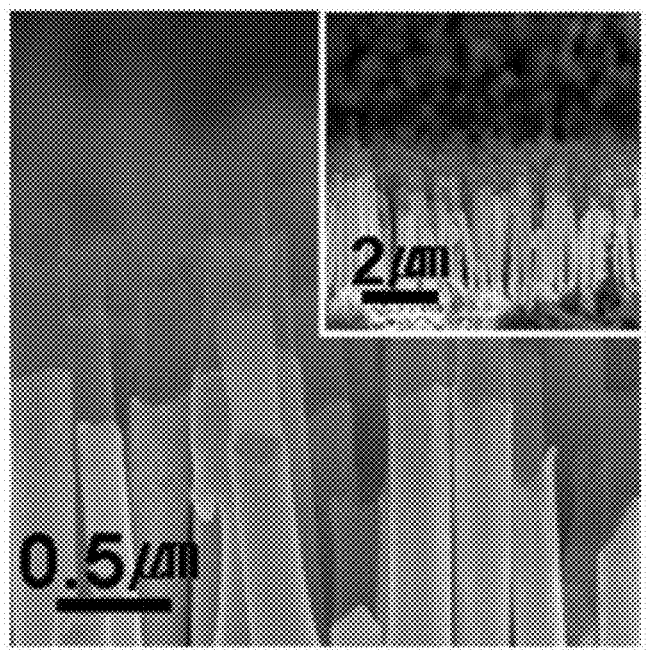
FIGS. 6A through 6D are field emission scanning electron microscope (FESEM) images of the production process of a nano/micro-sized diode, according to an exemplary embodiment of the present invention.

Next, the porous AAO template was dried at 80° C., for one hour, to remove the pyrrole and the solvent from the layer formed on the Au first electrode. As a result, first layers that were formed of polypyrrole and had protrusions, were formed on the Au first electrodes (refer to FIG. 5E). Part of the porous AAO template, in which the Au first electrodes and the first layers were formed, was sampled, and then the Ag thin film used as the working electrode and the porous AAO template were respectively dissolved in concentrated nitric acid and a 3M sodium hydroxide solution. The resulting structures in the holes were repeatedly washed, using distilled water, until the solution reached a pH of 7. The resultant was observed by field emission scanning electron microscopy (FESEM), and the results are illustrated in FIG. 6A.

Dissolution of the Walls of the Holes

After the polypyrrole first layer was formed as described above, the walls of the holes were dissolved using an aqueous 1M sodium hydroxide solution, to expand a space between the protrusions of the polypyrrole first layers and the walls of the holes (refer to FIG. 5E).

Preparation of Second Layer

Figure 6B:
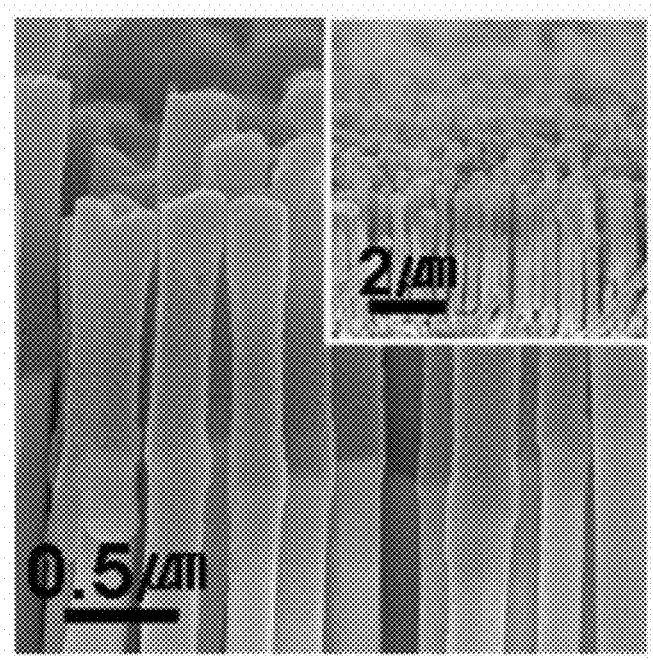

Next, the electropolymerization device was filled with an aqueous solution, including 0.3 M cadmium sulfide, 0.7 mM selenium dioxide, and 0.25 M sulfuric acid. Then, cyclic voltammetry was performed, at a scan rate of 750 mV/s and at a voltage in the range of −0.36 to −0.8 V, for 4000 cycles, to reduce cadmium selenide onto the first polypyrrole layer of each hole of the porous AAO template. As a result, a second layer, which was formed of cadmium selenide and had a recess corresponding to the protrusion of the polypyrrole first layer, was formed. The thickness of the second layer was adjusted to make the total thickness of the diode layer comprising the first layer and second layer to be 1500 nm (refer to FIG. 5F). A part of the porous AAO template, in which the Au first electrode, the polypyrrole first layer, and the CdSe second layer were formed, was sampled, and then the Ag thin film and the porous AAO template were respectively dissolved in a concentrated nitric acid and a 3M sodium hydroxide solution. The resulting structure was repeatedly washed using distilled water, until the solution reached a pH of 7. The resultant was observed by field emission scanning electron microscopy (FESEM), and the results are illustrated in FIG. 6B.

Preparation of Control Layer

Figure 6C:
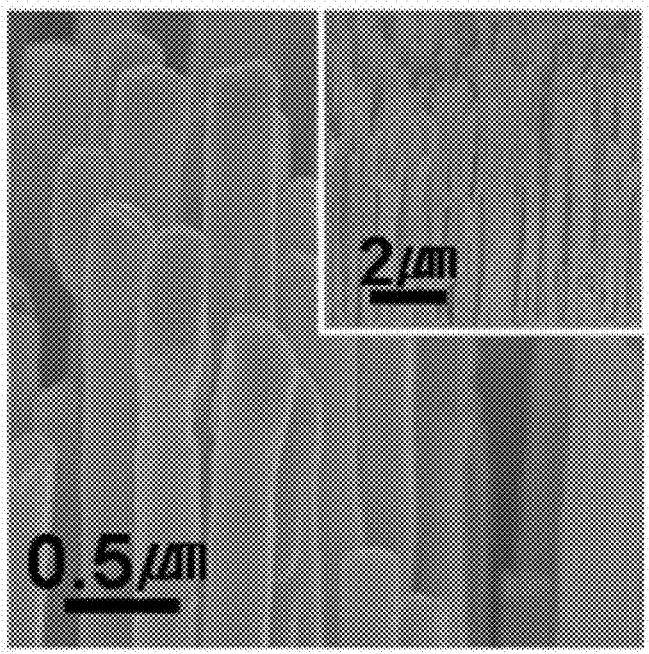

An Ag control layer was formed on the CdSe second layer. The Ag control layer was formed, by immersing the porous AAO template in a Technic ACR silver RTU solution (Technic, Inc.). A current was applied at a rate of 0.5 C/cm², for 1 minute, at a constant potential of −0.9 V vs Ag/AgCl, using the potentiostat. The thickness of the Ag control layer was 500 nm. A part of the porous AAO template, in which the Au first electrode, the polypyrrole first layer, the CdSe second layer, and the Ag control layer were formed, was sampled. Then the Ag thin film and the porous AAO template were respectively dissolved in a concentrated nitric acid and a 3M sodium hydroxide solution. The resulting structure was repeatedly washed using distilled water, until the solution reached a pH of 7. The resultant was observed by field emission scanning electron microscopy (FESEM), and the results are illustrated in FIG. 6C.

Preparation of Second Electrode

Figure 5H:
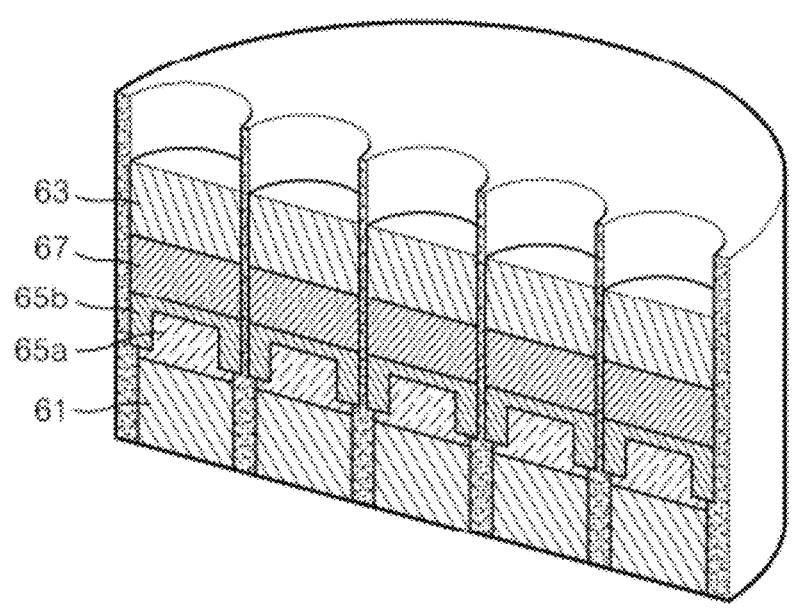

The porous AAO template was immersed in an Orotemp 24 RTU solution (Technic, Inc.), and then Au was plated at −0.9 V vs Ag/AgCl, to form an Au second electrode on the Ag control layer (refer to FIG. 5H). The thickness of the Au second electrode was 2000 nm.

Removal of Porous Template and Yield of Diode

Figure 6D:
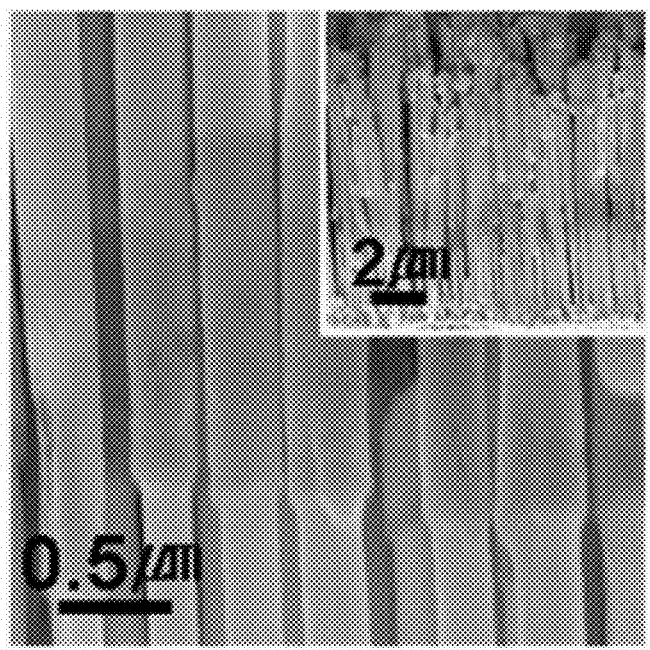
Figure 7A:
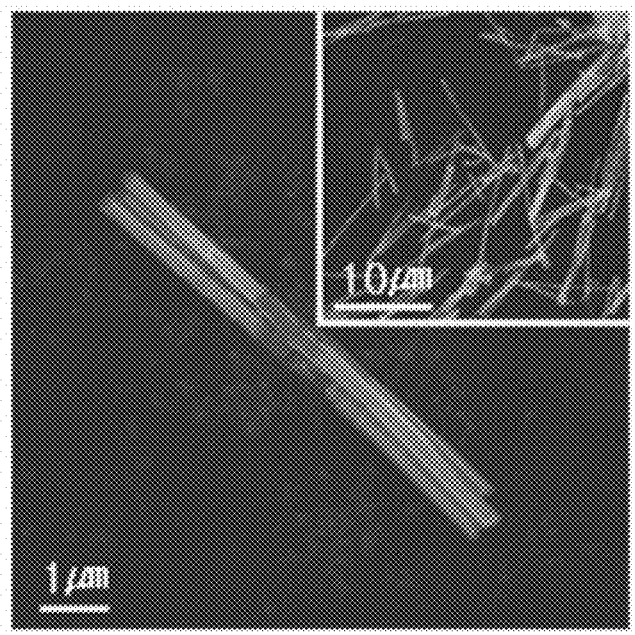
FIGS. 7A and 7B are FESEM images, taken with different magnifications, of a nano/micro-sized diode, according to an exemplary embodiment of the present invention.
Figure 7B:
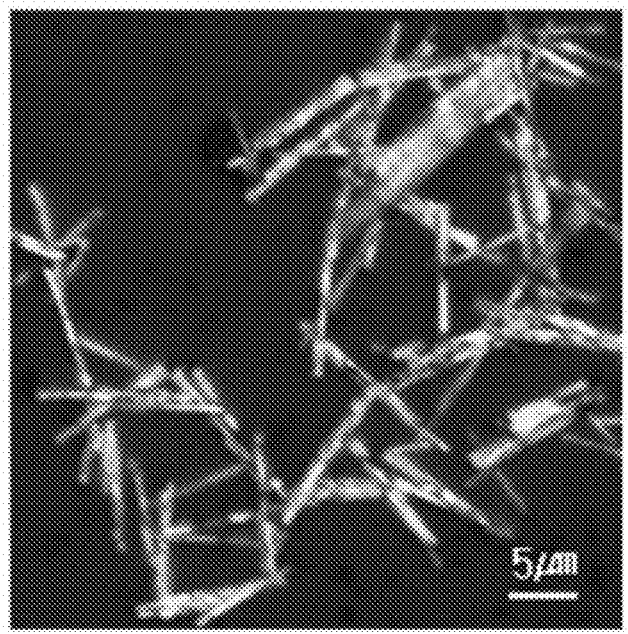

The Ag thin film used as the working electrode and the porous AAO template were respectively dissolved in a concentrated nitric acid and a 3M sodium hydroxide solution, to obtain a plurality of structures from the holes. Then, the resulting structures were repeatedly washed in distilled water, until the solution reached a pH of 7, to complete a manufacture of nanorod diodes (refer to FIG. 3B for a cross-section of the diode). The diodes were observed by FESEM, and the results are illustrated in FIG. 6D. In addition, the diodes were observed by FESEM at different magnifications, and the resulting FESEM images are shown in FIGS. 7A and 7B. The yield (number of undamaged diodes/total number of diodes× 100) of the diodes was calculated from FIG. 7B, and as a result, the yield of the diodes was confirmed to be about 70%.

Figure 8B:
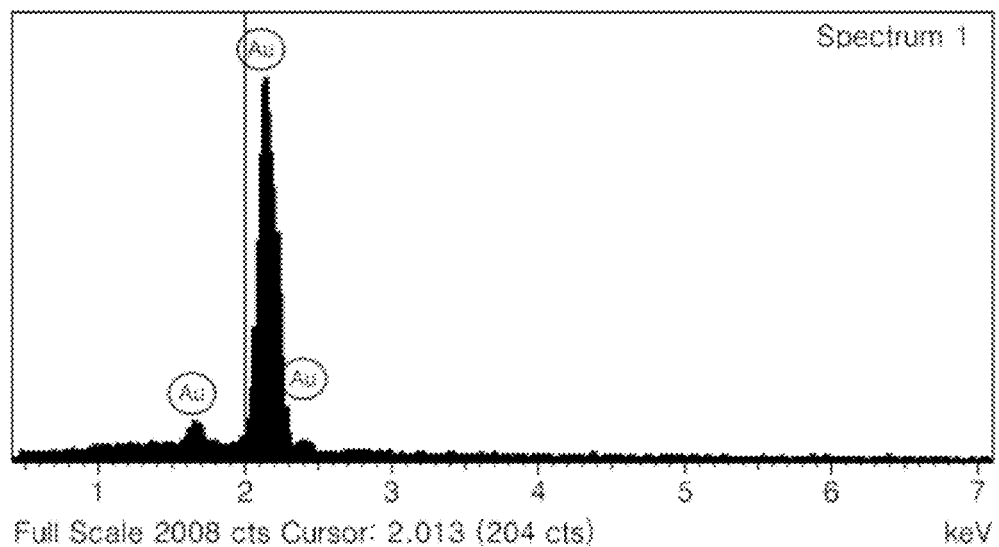
FIGS. 8B through 8D are energy dispersive spectroscopy (EDS) spectra of a nano/micro-sized diode, according to an exemplary embodiment of the present invention.
Figure 8C:
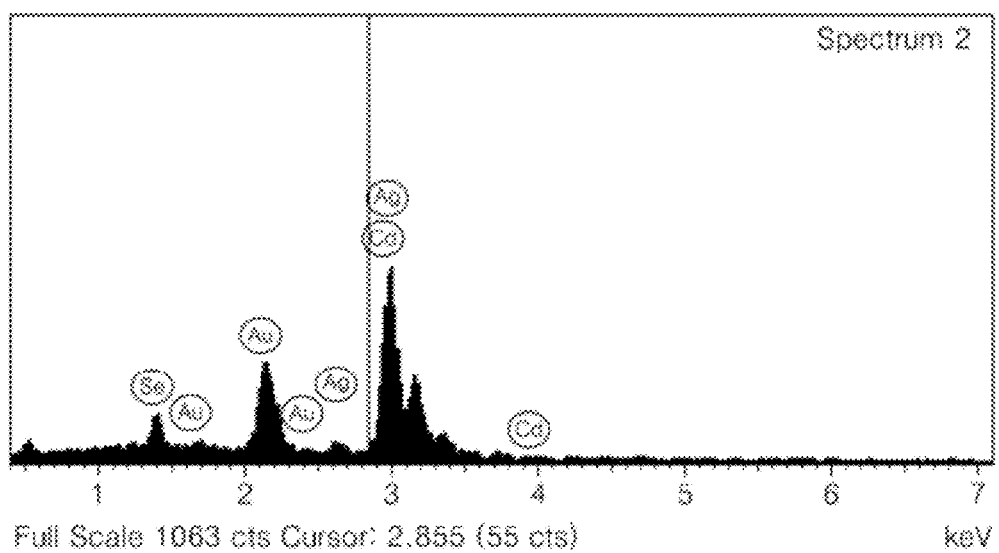
Figure 8D:
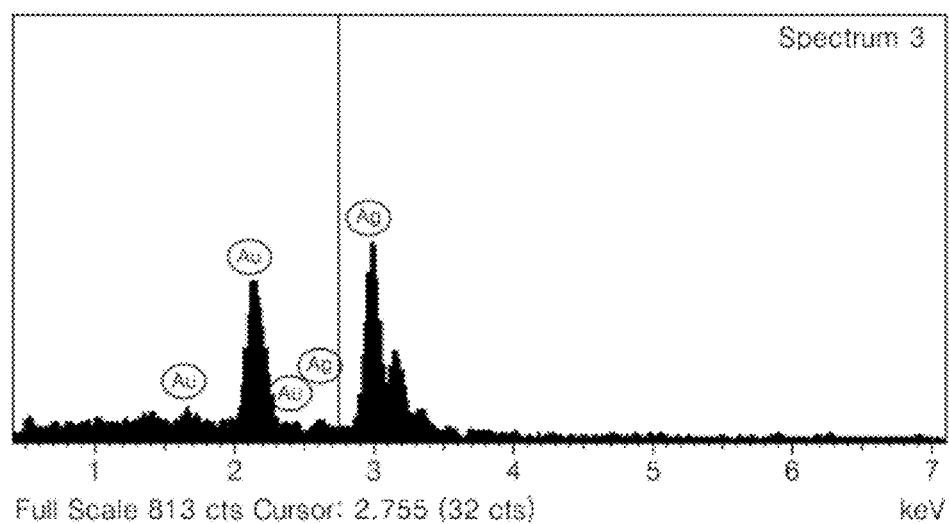

In addition, a scanning electron microscope (SEM) image of the diode at another magnification is illustrated in FIG. 8A. Energy dispersive spectroscopy (EDS) spectra of the diode were use for analyzing the composition in sites corresponding to Spectrum 1, Spectrum 2, and Spectrum 3 in FIG. 8A, which are respectively illustrated in FIGS. 8B, 8C and 8D. The composition analysis results of Spectrum 1, Spectrum 2, and Spectrum 3 are respectively shown in Tables 1, 2 and 3 below:

TABLE 1

| element | wt % | atomic % |
|---|---|---|
| Au | 100.00 | 100.00 |
| Total | 100.00 | 100.00 |

TABLE 2

| element | wt % | atomic % |
|---|---|---|
| Se | 6.17 | 9.38 |
| Ag | 62.47 | 69.48 |
| Cd | 4.44 | 4.74 |
| Au | 26.91 | 16.39 |
| Total | 100.00 | 100.00 |

TABLE 3

| element | wt % | atomic % |
|---|---|---|
| Ag | 59.97 | 73.23 |
| Au | 40.03 | 26.77 |
| Total | 100.00 | 100.00 |

Example 2

A diode (refer to FIG. 2B for a cross-section of the diode) was prepared in the same manner as in Example 1, except that after the polypyrrole first layer was formed, the CdSe second layer was formed without dissolving the walls of the holes of the porous AAO template.

Evaluation Example 1

Figure 9:
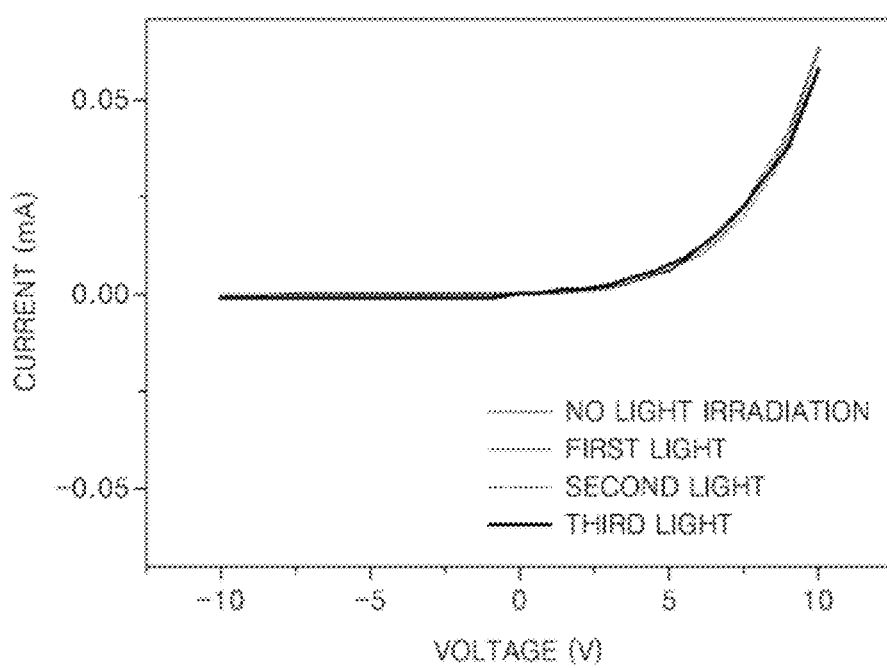
FIG. 9 is a graph showing voltage-current characteristics of a nano/micro-sized diode, according to an exemplary embodiment of the present invention.

Current-voltage characteristic curves, in the case of irradiating white light and no light irradiation on the diode prepared in Example 1, are illustrated in FIG. 9. In addition, current-voltage characteristic curves, in the case of irradiating white light and no light irradiation on the diode prepared in Example 2, are illustrated in FIG. 10 (In FIGS. 9 and 10, first light refers to 100 W white light, second light refers to 200 W white light, and third light refers to 300 W white light).

Figure 10:
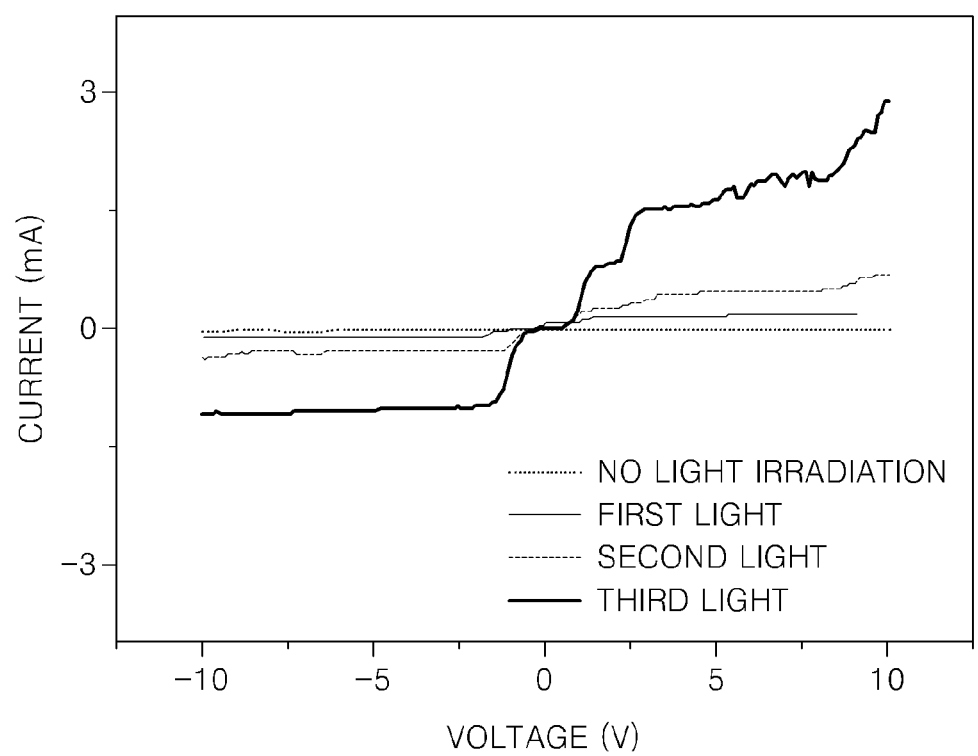
FIG. 10 is a graph showing voltage-current characteristics of a nano/micro-sized diode, according to another exemplary embodiment of the present invention.

From FIGS. 9 and 10, it can be seen that the nanorod diodes of Examples 1 and 2 exhibit diode-type current and voltage characteristics. In particular, from FIG. 9, it was confirmed that the nanorod diode of Example 1 did not have a breakdown voltage, even at −10V. In addition, from FIG. 10, it can be seen that light intensity of the nanorod diode of Example 2 depends on the current intensity.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. A nano/micro-sized diode comprising:
a first electrode;
a second electrode; and
a diode layer disposed between the first electrode and the second electrode, the diode layer comprising,
a first layer disposed on the first electrode, having a first surface that is electrically connected to the first electrode, and an opposing second surface having a protrusion, and
a second layer disposed between the first layer and the second electrode, having a first surface having a recess corresponding to the protrusion, and an opposing second surface that is electrically connected to the second electrode,
wherein the cross-sectional area of the surface of the first electrode which is contacted with the first surface of the first layer is the same as the cross-sectional area of the first surface of the first layer.

2. The diode of claim 1, further comprising a control layer disposed between the second electrode and the diode layer.

3. The diode of claim 2, wherein the second surface of the second layer is electrically connected to the control layer.

4. The diode of claim 2, wherein the control layer comprises a material selected from the group consisting of Ag, Cu, and Al.

5. The diode of claim 1, wherein a portion of the first surface of the second layer does not contact the second surface of the first layer.

6. The diode of claim 1, wherein the first electrode and the second electrode comprise a material independently selected from the group consisting of Pt, Au, Al, Ni, Mo, W, ITO, carbon, and carbon nanotubes.

7. The diode of claim 1, wherein the first layer of the diode layer comprises a conducting polymer selected from the group consisting of polypyrrole, polyaniline, polythiophene, polypyridine, polyazulene, polyindole, polycarbazole, polyazine, polyquinone, poly(3,4-ethylenedioxythiophene), polyacetylene, polyphenylene sulfide, polyphenylene vinylene, polyphenylene, polyisothianaphthene, poly(2-methoxy-5-(2'-ethyl)hexyloxy-p-phenylenevinylene (MEH-PPV), a mixture of polyethylenedioxythiophene (PEDOT) and polystyrenesulfonate (PSS), and a derivative thereof.

8. The diode of claim 1, wherein the first layer of the diode layer comprises indium-tin oxide (ITO) or indium-zinc oxide (IZO).

9. The diode of claim 1, wherein the second layer of the diode layer comprises a material selected from the group consisting of cadmium selenide (CdSe), cadmium telluride (CdTe), cadmium sulfide (CdS), and zinc oxide (ZnO).

10. The diode of claim 1, wherein the diode is shaped as a nanorod, a nanowire, a nanoneedle, a nanobelt, or a nanoribbon.

11. The diode of claim 1, wherein the cross-sectional area of the second surface of the second layer is the same as or greater than the cross-sectional area of the first electrode which is contacted with the first surface of the first layer.

* * * * *